US006281703B1

(12) United States Patent
Furuta et al.

(10) Patent No.: US 6,281,703 B1
(45) Date of Patent: Aug. 28, 2001

(54) PROGRAMMABLE DEVICE WITH AN ARRAY OF PROGRAMMABLE CELLS AND INTERCONNECTION NETWORK

(75) Inventors: Koichiro Furuta; Taro Fujii; Masato Motomura, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/493,154

(22) Filed: Jan. 28, 2000

(30) Foreign Application Priority Data

Jan. 28, 1999 (JP) .................................................. 11-019616

(51) Int. Cl.[7] .............................................. H03K 19/177
(52) U.S. Cl. ................... 326/40; 326/41; 326/38
(58) Field of Search ................ 326/39, 40, 41, 326/38

(56) References Cited

U.S. PATENT DOCUMENTS

| 5,809,281 | * | 9/1998 | Steele et al. | 395/497.01 |
| 5,815,004 | * | 9/1998 | Trimberger et al. | 326/41 |
| 5,850,152 | * | 12/1998 | Cliff et al. | 326/40 |
| 6,094,066 | * | 7/2000 | Mavis | 326/41 |
| 6,097,988 | * | 8/2000 | Tobias | 700/23 |
| 6,107,821 | * | 8/2000 | Kelem et al. | 326/38 |
| 6,107,824 | * | 8/2000 | Reddy et al. | 326/41 |
| 6,130,553 | * | 10/2000 | Nakaya | 326/39 |

FOREIGN PATENT DOCUMENTS

| 0 668 659 | 8/1995 | (EP) . |
| 0 748 051 | 12/1996 | (EP) . |
| 2 304 438 | 3/1997 | (GB) . |
| 8-51356 | 2/1996 | (JP) . |
| 9-231788 | 9/1997 | (JP) . |

* cited by examiner

Primary Examiner—Michael Tokar
Assistant Examiner—Vibol Tan
(74) Attorney, Agent, or Firm—Young & Thompson

(57) ABSTRACT

The present invention provide a programmable device comprising: an array of plural programmable cells; a first sub-interconnection network comprising a plurality of first interconnections which extend to surround each of the plural programmable cells for transmitting data; and a second sub-interconnection network comprising a plurality of second interconnections which extend to surround each of the plural programmable cells for transmitting control informations, so that each of the plural programmable cells selects one of plural configuable informations stored therein in accordance with the control information supplied from the second sub-interconnection network.

19 Claims, 7 Drawing Sheets

PROGRAMMABLE DEVICE WITH AN ARRAY OF PROGRAMMABLE CELLS AND INTERCONNECTION NETWORK

BACKGROUND OF THE INVENTION

The present invention relates to a programmable logic device such as a field programmable gate array, and more particularly to a programmable cell included in a programmable logic device and a configuration of an interconnection network.

A programmable device or a programmable logic LSI such as a field programmable gate array has, in its inside, informations about configuration which specifies a hardware configuration, so that in accordance with the configuration information, a desired hardware is realized. In recent years, the hardware scale realizable by the programmable device has been on the increase as semiconductor fabrication techniques have been progressed. In this circumstance, in place of the gate array LSI, the programmable device has received a great deal of attention.

The programmable device may be classified into the following two typical types. The first type programmable device is disclosed in U.S. Pat. No. 4,870,302 issued to Xilinx and its re-issued Pat. No. 34,363 entitled "Configurable Electrical Circuit Having Configurable Logic Elements and Configurable Interconnections".

The second type programmable device is disclosed in U.S. Pat. No. 5,583,450 issued to Xilinx entitled "Sequencer For A Time Multiplexed Programmable Logic Device", and disclosed in U.S. Pat. No. 5,600,263 entitled "Configuration Modes For A Time Multiplexed Programmable Logic Device", and also disclosed in U.S. Pat. No. 5,629,637 entitled "Method Of Time Multiplexing A Programmable Logic Device", as well as disclosed in U.S. Pat. No. 5,646,545 entitled "Time Multiplexed Programmable Logic Device".

The first type programmable device comprises a combination of programmable logic cells and programmable interconnection cells, wherein logic cells and interconnection cells make pairs to be arranged to form a two-dimensional array.

The second type programmable device has a plurality of configurable informations in the logic cells and the interconnection cells so that selection of one configurable information is changed over time to other configurable information in order to time-multiplex the first type programmable devices.

The above U.S. patents are silent on interconnections for switching the configurable information and also silent on the method of switching the configurable information. It is required that the configurable information and input information for logic operations in the logic cells are controlled for every one bit and interconnections are provided for individuals, for which reasons it is also required that the interconnections are connected and switching is controlled for every one bit of the configurable information.

In the programmable device, however, switching the configurable information generally needs changes of all bits, for which reason it is not required that interconnections are connected for every bits to control the switching of the configurable information. In the programmable device, generally, the configurable informations of all of the logic cells are switched to realize entirely different functions or the configurable informations of some logic cells are switched to realize partially different functions. It is rare that the configurable information of each logic cell is switched. Accordingly, if the interconnections are connected to each bit of the configurable informations and subsequent control to switching the configurable information in the logic cell unit, then a large number of the interconnections is required, resulting in an increased occupied area of the programmable device and also in an increased power consumption.

If control informations for controlling switching operations of the configurable informations are generated outside or inside of the programmable device, it takes a long time to enter the control informations into the individual logic cells. This means that the conventional programmable device needs a long arithmetic time for switching the configurable informations.

In the above circumstances, it had been required to develop a novel programmable device free from the above problem.

SUMMARY OF THE INVENTION

Accordingly, it is an object of the present invention to provide a novel programmable device free from the above problems.

It is a further object of the present invention to provide a novel programmable device with a small area.

It is a still further object of the present invention to provide a novel programmable device with a small power consumption.

It is yet a further object of the present invention to provide a novel programmable device with a small arithmetic time for switching configurable informations.

The present invention provides a programmable device comprising: an array of plural programmable cells; a first sub-interconnection network comprising a plurality of first interconnections which extend to surround each of the plural programmable cells for transmitting data; and a second sub-interconnection network comprising a plurality of second interconnections which extend to surround each of the plural programmable cells for transmitting control informations, so that each of the plural programmable cells selects one of plural configuable informations stored therein in accordance with the control information supplied from the second sub-interconnection network.

The above and other objects, features and advantages of the present invention will be apparent from the following descriptions.

BRIEF DESCRIPTION OF THE DRAWINGS

Preferred embodiments according to the pre invention will be described in detail with reference to the accompanying drawings.

DISCLOSURE OF THE INVENTION

Figure 1:
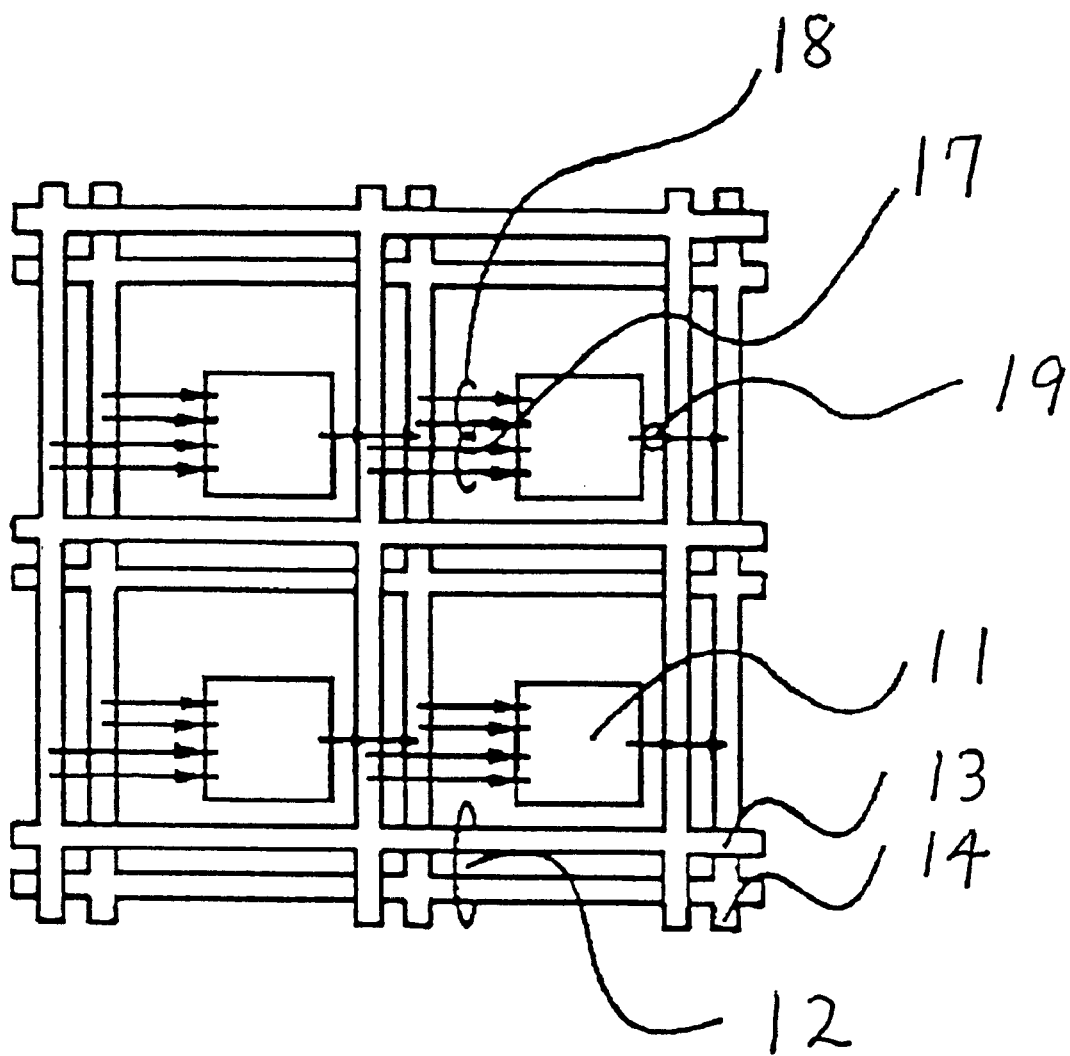
FIG. 1 is a block diagram illustrative of a configuration of a programmable device in a first embodiment in accordance with the present invention.

The first present invention provides a programmable device comprising: an array of plural programmable cells which are connected to an interconnection network for transmitting at least control informations to the plural programmable cells, so that each of the plural programmable cells selects one of plural configurable informations in accordance with the control information.

It is preferable that each of the programmable cells further comprises: at least an internal memory for storing the plural configurable informations, and the internal memory being connected to the interconnection network for receiving the control information so that the internal memory selects one of the plural configurable informations in accordance with the control information; and an arithmetic logic circuit being connected to the internal memory for receiving the selected one of the plural configurable informations, and the arithmetic logic circuit being also connected to the interconnection network for receiving data from the interconnection network to perform logic operations of the selected one of the plural configurable informations and the data and send an arithmetic result to the interconnection network.

It is further preferable that the interconnection network extends to surround each of the plural programmable cells, and the interconnection network comprises a first sub-interconnection network comprising plural first interconnections for transmitting the data and a second sub-interconnection network comprising plural second interconnections for transmitting the control informations.

It is further more preferable that the internal memory is connected to the second sub-interconnection network for receiving the control informations from the second sub-interconnection network, and the arithmetic logic circuit is also connected to the first interconnection network for receiving said data from the first interconnection network.

It is moreover preferable that the array of plural programmable cells comprises a plurality of sub-cell arrays, and each of the sub-cell arrays having a plurality of the programmable cells which are connected to at least the same interconnection of the second sub-interconnection network for receiving the control information.

It is still more preferable that a single common control information transmission line is further provided for each of the sub-cell arrays, so that the programmable cells in the same sub-cell array are connected through the single common control information transmission line to the second sub-interconnection network.

It is still further more preferable that a control circuit is further provided for each of the sub-cell arrays, so that the single common control information transmission line is connected through the control circuit to the second sub-interconnection network It is yet further more preferable that the control circuit stores the control information and sends the control information upon input of a synchronizing signal into the control circuit.

It is moreover preferable that the control circuit comprises: a memory circuit for storing a memory information; a sub-control circuit connected to the second sub-interconnection network for receiving the control information from the second sub-interconnection network and also connected to the memory circuit for receiving the memory information from the memory circuit, so that the sub-control circuit performs logic operations of the control information and the memory information to output an arithmetic result; a latch circuit connected to the sub-control circuit for receiving the arithmetic result from the sub-control circuit and latches the arithmetic result to output the arithmetic result in synchronizing with an input of a synchronizing signal; and a selecting circuit being connected to the latch circuit for receiving the arithmetic result from the latch circuit, and also the selecting circuit being connected to the sub-control circuit for receiving the arithmetic result from the sub-control circuit, and also the selecting circuit being connected to the memory circuit for receiving the memory information from the memory circuit, so that the selecting circuit selects one of the arithmetic results in accordance with the memory information to output selected one of the arithmetic results as a selected control information.

It is also preferable that the control circuit is connected to plural interconnections of the second sub-interconnection network, and the plural interconnections being different at least partially from each other for receiving plural control informations from the plural interconnections.

It is further preferable that the control circuit comprises: a memory circuit for storing plural memory informations, and the memory a circuit being connected to a decoder circuit for receiving a decoded signal from the decoder circuit, so that the memory circuit selects one of the plural memory informations in accordance with the decoded signal; a selecting circuit being connected to the plural interconnections of the second sub-interconnection network for receiving the plural control informations, and the selecting circuit being also connected to the memory circuit for receiving selected one of the plural memory informations, so that the selecting circuit selects one of the plural control informations to output selected one of the control informations; and a flip-flop circuit being connected to the selecting circuit for receiving the selected control information from the selecting circuit and holds the control information to output the selected control information in synchronizing with an input of a clock signal into the flip-flop circuit.

The second present invention provides a programmable device comprising: an array of plural programmable cells; a first sub-interconnection network comprising a plurality of first interconnections which extend to surround each of the plural programmable cells for transmitting data; and a second sub-interconnection network comprising a plurality of second interconnections which extend to surround each of the plural programmable cells for transmitting control informations, so that each of the plural programmable cells selects one of plural configurable informations stored therein in accordance with the control information supplied from the second sub-interconnection network.

It is preferable that each of the programmable cells further comprises: at least an internal memory for storing the plural configurable informations, and the internal memory being connected to the second sub-interconnection network for receiving the control information so that the internal memory selects one of the plural configurable informations in accordance with the control informations; and an arithmetic logic circuit being connected to the internal memory for receiving the selected one of the plural configurable informations, and the arithmetic logic circuit being also connected to the first sub-interconnection network for receiving the data from the first sub-interconnection network to perform logic operations of the selected one of the plural configurable informations and the data and send an arithmetic result to the first sub-interconnection network.

It is also preferable that the array of plural programmable cells comprises a plurality of sub-cell arrays, and each of the sub-cell arrays having a plurality of the programmable cells which are connected to at least the same interconnection of the second sub-interconnection network for receiving the control information.

It is further preferable that a single common control information transmission line is further provided for each of the sub-cell arrays, so that the programmable cells in the same sub-cell array are connected through the single common control information transmission line to the second sub-interconnection network.

It is further more preferable that a control circuit is further provided for each of the sub-cell arrays, so that the single common control information transmission line is connected through the control circuit to the second sub-interconnection network.

It is moreover preferable that the control circuit stores the control information and sends the control information upon input of a synchronizing signal into the control circuit.

It is still further preferable that the control circuit comprises: a memory circuit for storing a memory information; a sub-control circuit connected to the second sub-interconnection network for receiving the control information from the second sub-interconnection network and also connected to the memory circuit for receiving the memory information from the memory circuit, so that the sub-control circuit performs logic operations of the control information and the memory information to output an arithmetic result; a latch circuit connected to the sub-control circuit for receiving the arithmetic result from the sub-control circuit and latches the arithmetic result to output the arithmetic result in synchronizing with an input of a synchronizing signal; and a selecting circuit being connected to the latch circuit for receiving the arithmetic result from the latch circuit, and also the selecting circuit being connected to the sub-control circuit for receiving the arithmetic result from the sub-control circuit, and also the selecting circuit being connected to the memory circuit for receiving the memory information from the memory circuit, so that the selecting circuit selects one of the arithmetic results in accordance with the memory information to output selected one of the arithmetic results as a selected control information.

It is also preferable that the control circuit is connected to plural interconnections of the second sub-interconnection network, and the plural interconnections being different at least partially from each other for receiving plural control informations from the plural interconnections.

It is further preferable that the control circuit comprises: a memory circuit for storing plural memory informations, and the memory circuit being connected to a decoder circuit for receiving a decoded signal from the decoder circuit, so that the memory circuit selects one of the plural memory informations in accordance with the decoded signal; a selecting circuit being connected to the plural interconnections of the second sub-interconnection network for receiving the plural control informations, and the selecting circuit being also connected to the memory circuit for receiving selected one of the plural memory informations, so that the selecting circuit selects one of the plural control informations to output selected one of the control informations; and a flip-flop circuit being connected to the selecting circuit for receiving the selected control information from the selecting circuit and holds the control information to output the selected control information in synchronizing with an input of a clock signal into the flip-flop circuit.

Preferred Embodiment

First Embodiment

A first embodiment according to the present invention will be described in detail with reference to the drawings. FIG. 1 is a block diagram illustrative of a configuration of a programmable device in a first embodiment in accordance with the present invention. The programmable device has a two-dimensional array of programmable cells 11 and interconnection networks 12 surrounding each of programmable cells 11. The interconnection networks 12 comprise first sub-interconnection networks 13 for transmission of data and second sub-interconnection networks 14 for transmission of control informations.

Each of the programmable cells 11 has data input ports 17 and control information input ports 18 and a single output port 19. The data input ports 17 are connected to all or a part of the first sub-interconnection networks 13. The control information input ports 18 are also connected to all or a part of the second sub-interconnection networks 14. The output port 19 is connected to all or a part of the first and second sub-interconnection networks 13 and 14.

Figure 2:
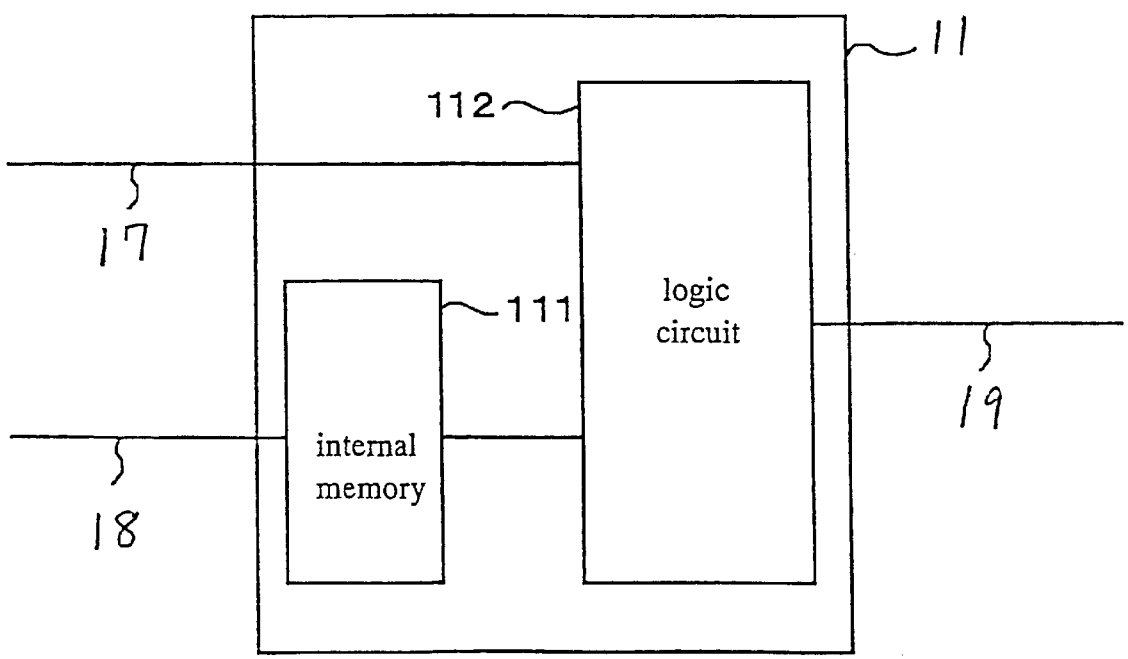
FIG. 2 is a block diagram illustrative of a configuration of each programmable cell included in the two-dimensional array of the programmable device shown in FIG. 1.

FIG. 2 is a block diagram illustrative of a configuration of each programmable cell included in the two-dimensional array of he programmable device shown in FIG. 1. The programmable cell 11 has an internal memory 111 and a combined logic circuit 112. The internal memory 111 is connected to the control information input port 18 and also connected to the combined logic circuit 112. The combined logic circuit 112 is connected to the data input port 17 and the output port 19 as well as connected to the internal memory 111. The internal memory 111 stores a plurality of configurable informations and allows selected one of the configurable informations to be read out. The combined logic circuit 112 may comprise logic gates such as AND-gates, OR-gates and NOT-gates. One of the plural configurable informations stored in the internal memory 111 is selected in accordance with the control information which has been inputted through the control information input port 18 from the second sub-interconnection network 14 so that the selected configurable information is transmitted to the combined logic circuit 112. Data are further transmitted from the first sub-interconnection network 13 through the data input port 17 to the combined logic circuit 112. The combined logic circuit 112 performs logic operations of the data informations and the selected configurable information. An arithmetic result is outputted from the combined logic circuit 112 through the output port 19. The arithmetic result is then transmitted through the first or second data sub-interconnection network 13 or 14.

At least a part of interconnections constituting the first sub-interconnection networks 13 for data transmissions and at least a part of interconnections constituting the second sub-interconnection networks 14 for control information transmissions are connected to external connective terminals not illustrated. Input informations and control informations are entered through the external connective terminals into the programmable cell 11. The configurable informations are written into the internal memory 111 in the programmable cell 11 in initialization.

Operations of the programmable device in this embodiment will be described, assuming that a plurality of he configurable informations have already been stored in the internal memory 111 in the programmable cell 11.

In a first step, control informations are supplied from the outside of the programmable cell, wherein the control informations are transmitted from the external connective terminal through the second sub-interconnection networks 14 and the control information input ports 18 to the internal memory 111 in the programmable cell 11, so that any one of the configurable informations stored in the internal memory 111 is selected in accordance with the control informations and outputted from the internal memory 111 and transmitted to the combined logic circuit 112, wherein the internal memory 111 and the combined logic circuit 112 are included in the programmable cell 11 having the control information input port 18 which is connected to the second sub-interconnection network 14 connected to only the external connective terminal.

In a second step, input informations are transmitted from the external connective terminal through the first sub-interconnection networks 13 and the data input port 17 into the combined logic circuit 112 included in the programmable cell 11 having the data input port 17 which is connected to the first sub-interconnection network 13 connected to only the external connective terminal. The combined logic circuit 112 performs logic operations of the input informations and the selected configurable information so as to transmit an arithmetic result through the output port 19 to the first or second sub-interconnection network 13 or 14.

In the third step, control informations from the control information input port 18 are defined in the programmable cell 11 having the control information input port 18 connected to the interconnections constituting the second sub-interconnection network 13 connected to the external connective terminal where logic operations are defined in the above second step. One of the configurable informations stored in the internal memory 111 is selected in accordance with the control information and then outputted from the internal memory 111.

In the fourth step, the selected one of the configurable informations is transmitted from the internal memory 111 to the combined logic circuit 112. The arithmetic result as the input information is transmitted through the data input port 17 to the combined logic circuit 112. The combined logic circuit 112 performs logic operations of the selected one of the configurable informations and the input information. A result of the logic operation of the selected one of the informations and the input information by the combined logic circuit configurable 112 is outputted from the output port 19 and then transmitted onto the first or second sub-interconnection network 13 or 14.

The above third and fourth steps will be repeated until the input informations and control informations inputted into all of the programmable cells 11 are defined and the combined logic circuit 112 performs the logic operation to output the result of the logic operation from the output port 18.

As described above, one of the configurable informations stored in the internal memory 111 in the programmable cell 11 is selected in accordance with the control information having been supplied through the first sub-interconnection network 13 for the control information transmission and the control information input port 18. For this reason, it is unnecessary to control the configurable informations for every bits. It is possible to reduce the number of the necessary interconnections constituting the first sub-interconnection network 13 for entering the control informations into the internal memory 111 in the programmable cell 11. A desired one of the configurable informations stored in the internal memory 111 in the programmable cell 11 may be selected in accordance with the control information entered from the control information input port 18. The programmable cell 11 can control the selection of the configurable informations and also allows reductions in the necessary area and number for the interconnections, whereby the necessary power consumption can also be reduced.

Whereas, in this first embodiment, data are transmitted through the first sub-interconnection network 13 and the data input port 17 to the combined logic circuit 112 in the programmable cell 11 whilst the control informations are transmitted through the second sub-interconnection network 14 and the control information input port 18 to the internal memory 111 in the programmable cell 11. It is, however, possible to modify the above structure into the following. Namely, adjacent two of the programmable cells are interconnected to each other through a private line, so that the data input information and the control information are directly sent from one of the programmable cell to another one.

Whereas, in this first embodiment, the programmable cells are shaped in rectangle and aligned in matrix, it is possible to modify the programmable cells to that the programmable cells are shaped in hexagon and aligned in honeycomb and first and second sub-interconnection networks extend to surround the programmable cells.

Second Embodiment

Figure 3:
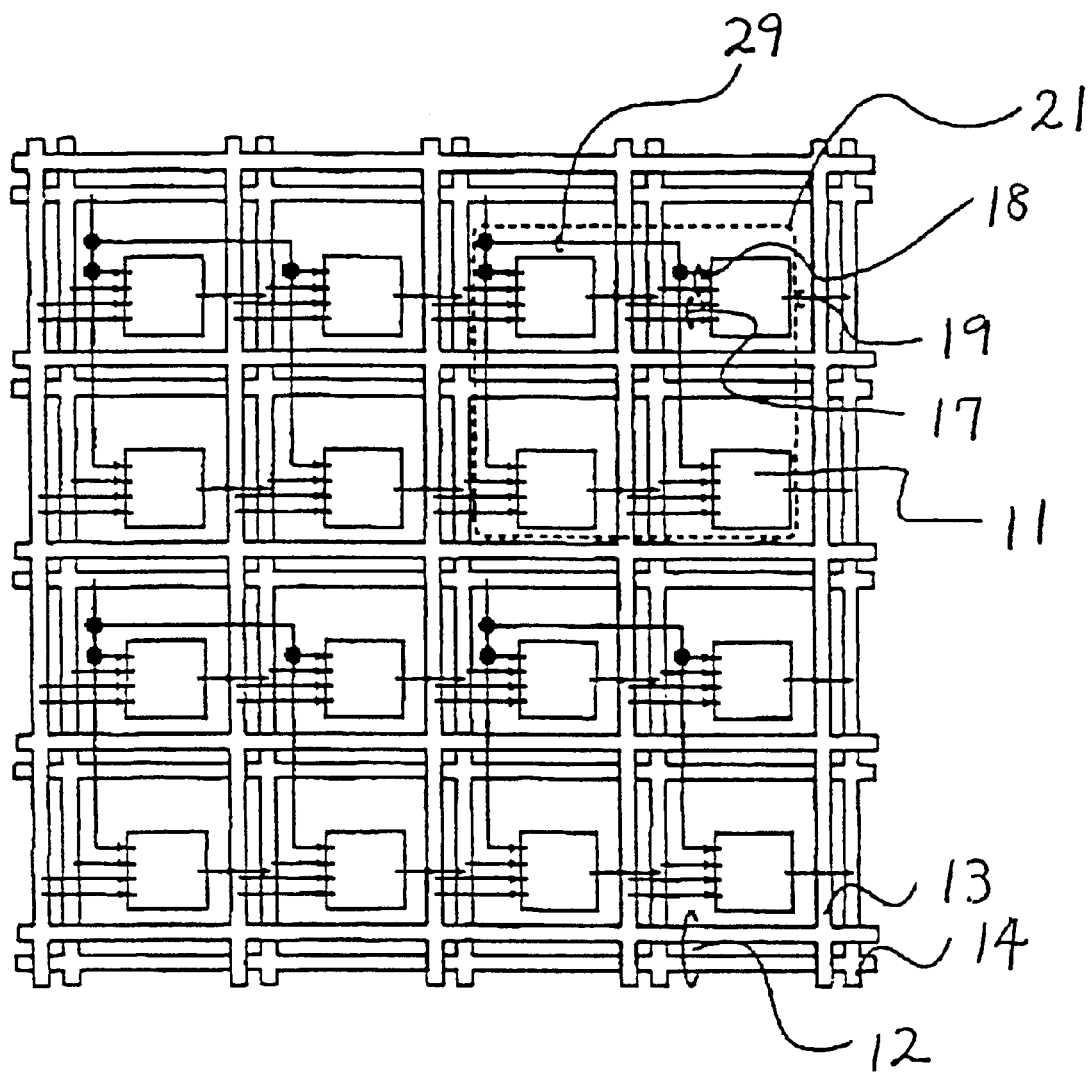
FIG. 3 is a block diagram illustrative of a configuration of a programmable device in a second embodiment in accordance with the present invention.

A second embodiment according to the present invention will be described in detail with reference to the drawings. FIG. 3 is a block diagram illustrative of a configuration of a programmable device in a second embodiment in accordance with the present invention. The programmable device has a two-dimensional array of a plurality of sub-cell arrays 21. Each of the sub-cell arrays 21 comprises a 2×2 array of programmable cells 11. The programmable device freer has interconnection networks 12 surrounding each of programmable cells 11. The interconnection networks 12 comprise first sub-interconnection networks 13 for transmission of data and second sub-interconnection networks 14 for transmission of control informations. Each of the sub-cell arrays 21 has a common control information input line 29 which is connected to four control information input ports 18 of the four programmable cells 11 which form the 2×2 sub-cell array 21. The common control information input line 29 is also connected to one interconnection of the second sub-interconnection networks 14, so that the four control information input ports 18 of the four programmable cells 11 which form the 2×2 sub-cell array 21 are connected through the common control information input line 29 to the one interconnection of the second sub-interconnection networks 14. Other configurations are the same as in the first embodiment, for which reason the descriptions will be omitted.

Operations of the above programmable device of this second embodiment are the same as in the first embodiment except for the followings. The descriptions will focus on differences in operations of the programmable device of this second embodiment from the first embodiment.

Control informations for the four programmable cells 11 in each of the sub-cell arrays 21 are transmitted through the same interconnection of the second sub-interconnection network 14 and through the common control information input line 29 into the four control information input ports 18 of the four programmable cells 11 which form the 2×2 sub-cell array 21, whereby configurable informations stored in the internal memories 111 in the four programmable cells 11 which form the 2×2 sub-cell array 21 are concurrently selected in accordance with the control information concurrently supplied. The selected configurable informations and the inputted informations about data are subjected to the concurrent logic operations by the four programmable cells 11 which form the 2×2 sub-cell array 21 and then the results of the concurrent logic operations by the four programmable cells 11 which form the 2×2 sub-cell array 21 are concurrently defined.

As described above, the control information input ports 18 of the four the programmable cells 11 which form the 2×2 sub-cell array 21 are connected through the single common control information input port 29 to the same interconnection of the second sub-interconnection networks 14, so that configurable informations are concurrently selected or switched in the four programmable cells 11 which form the 2×2 sub-cell array 21, whereby it is possible to reduce the number of the interconnections of the second sub-interconnection networks 14, resulting in reductions in the necessary area and number for the interconnections. Further, the necessary power consumption can also be reduced.

Whereas, in this second embodiment, data are transmitted through the first sub-interconnection network 13 and the data input port 17 to the combined logic circuit 112 in the programmable cell 11 whilst the control informations are transmitted through the second sub-interconnection network 14 and the control information input port 18 to the internal memory 111 in the programmable cell 11. It is, however, possible to modify the above structure into the following. Namely, adjacent two of the programmable cells are interconnected to each other through a private line, so that the data input information and the control information are directly sent from one of the programmable cell to another one.

Whereas, in this second embodiment, the programmable cells are shaped in rectangle and aligned in matrix, it is possible to modify the programmable cells to that the programmable cells are shaped in hexagon and aligned in honeycomb and first and second sub-interconnection networks extend to surround the programmable cells.

Whereas, in this second embodiment, the sub-cell array comprises the 2×2 arrays of four programmable cells and the single common control information transmission line is provided for each of the sub-cell array and connected to the four control information input ports of the four programmable cells in the sub-cell array, it is possible to modify the array to that the sub-cell array comprises an m×n array of the programmable cells, where m and n are the integers of not less than 1. The sub-cell array may also comprise other arrays than the matrix array. It is also possible that the sub-cell arrays are different in the number of the programmable cells included in the sub-cell arrays.

Third Embodiment

Figure 4:
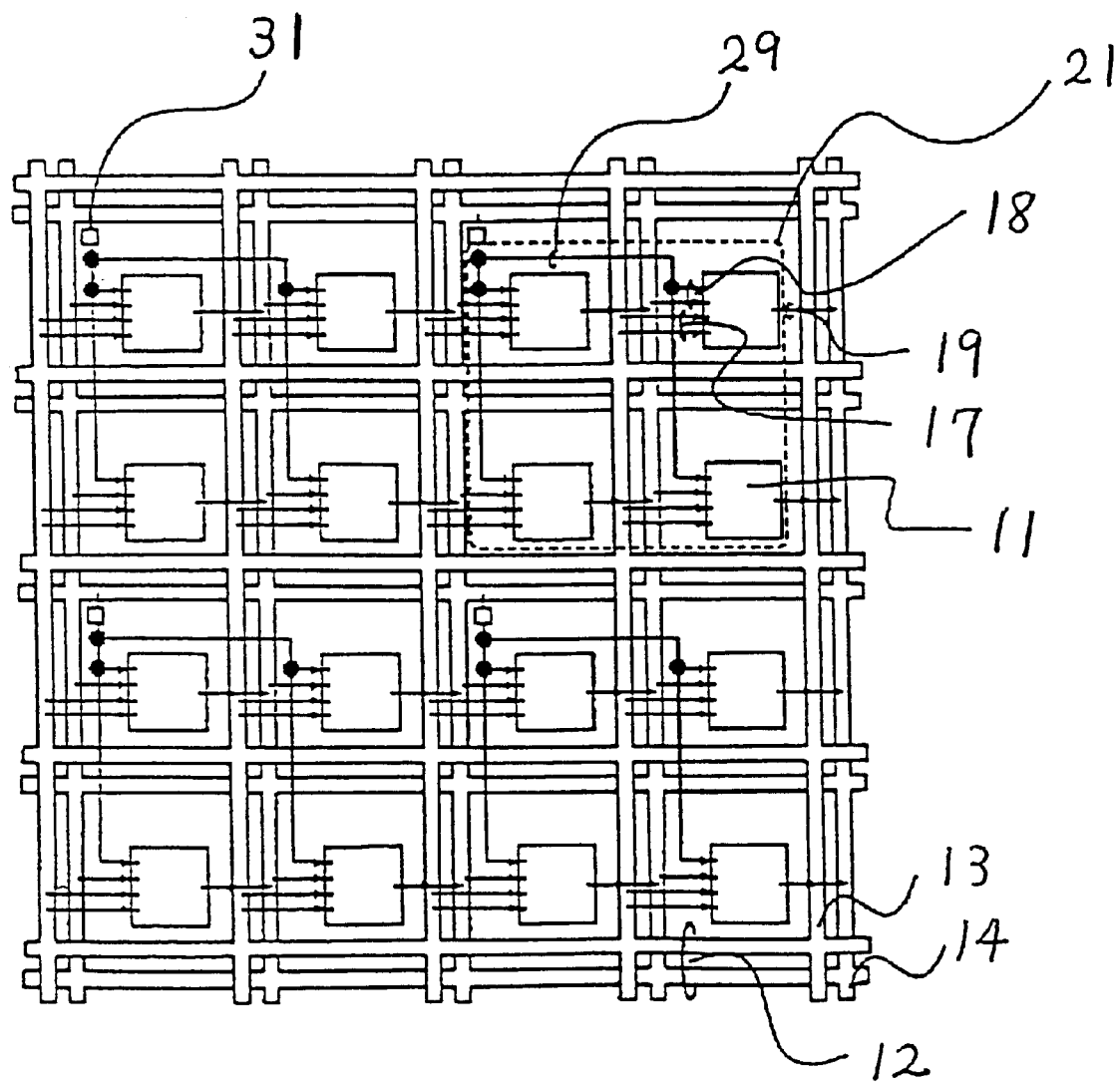
FIG. 4 is a block diagram illustrative of a configuration of a programmable device in a third embodiment in accordance with the present invention.

A third embodiment according to the present invention will be described in detail with reference to the drawings. FIG. 4 is a block diagram illustrative of a configuration of a programmable device in a third embodiment in accordance with the present invention. The programmable device has a two-dimensional array of a plurality of sub-cell arrays 21. Each of the sub-cell arrays 21 comprises a 2×2 array of programmable cells 11. The programmable device further has interconnection networks 12 surrounding each of programmable cells 11. The interconnection networks 12 comprise first sub-interconnection networks 13 for transmission of data and second sub-interconnection networks 14 for transmission of control informations. Each of the sub-cell arrays 21 has a common control information input line 29 which is connected to four control information input ports 18 of the four programmable cells 11 which form the 2×2 sub-cell array 21. The common control information input line 29 is also connected through a control circuit 31 to one interconnection of the second sub-interconnection networks 14, so that the four control information input ports 18 of the four programmable cells 11 which form the 2×2 sub-cell array 21 are connected through the common control information input line 29 and the control circuit 31 to the one interconnection of the second sub-interconnection networks 14. Namely, each of the sub-cell arrays 21 has the single control circuit 31. The control circuit 31 is supplied with a synchronizing signal transmitted through an interconnection not illustrated. Other configurations are the same as in the first embodiment, for which reason the descriptions will be omitted.

Figure 5:
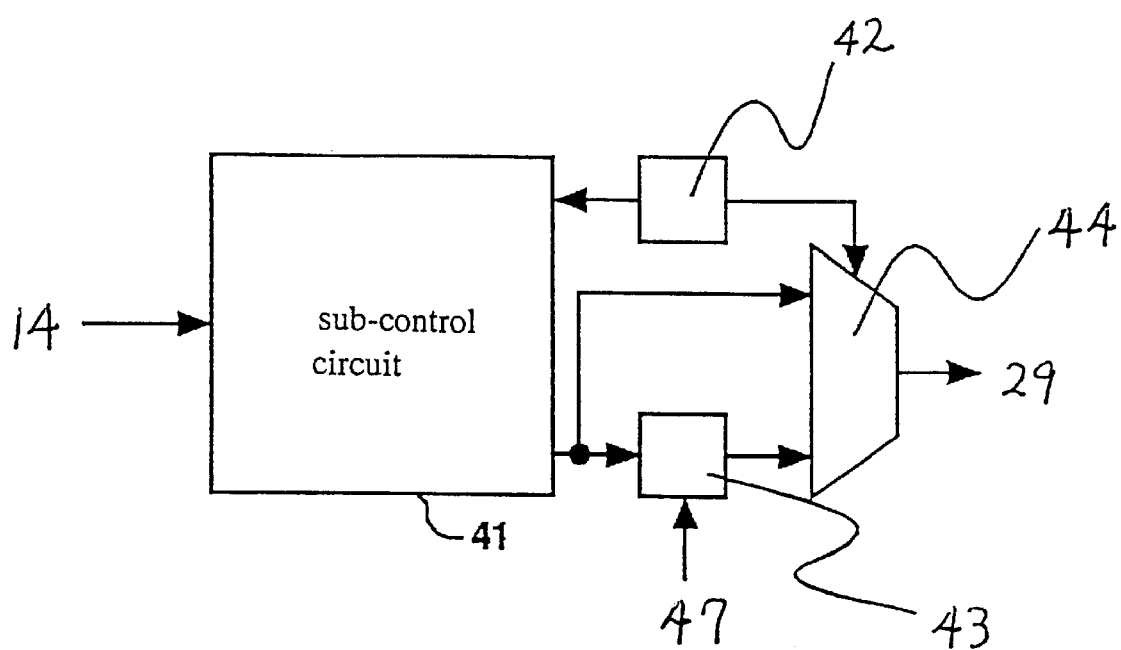
FIG. 5 is a block diagram illustrative of a configuration of the control circuit shown in FIG. 4.

FIG. 5 is a block diagram illustrative of a configuration of the control circuit shown in FIG. 4. The control circuit 31 is connected between the interconnection of the second sub-interconnection networks 14 and the common control information input line 29. The control circuit 31 comprises a sub-control circuit 41, a memory circuit 42, a latch circuit 43 and a selecting circuit 44.

The sub-control circuit 41 is connected to the interconnection of the second sub-interconnection networks 14 for receiving the control information transmitted through the interconnection of the second sub-interconnection networks 14. Be sub-control circuit 41 is also connected to the memory circuit 42 for receiving the stored information from the memory circuit 42. The sub-control circuit 41 is also connected to the latch circuit 43. The sub-control circuit 41 is also connected to the selecting circuit 44. The sub-control circuit 41 receives the control information form the interconnection of the second sub-interconnection networks 14 and also receives the stored information from the memory circuit 42, so that the sub-control circuit 41 performs logic operations of the control information and the stored information to send a result of the logic operations to the latch circuit 43 and the selecting circuit 44. The sub-control circuit 41 may comprise combined logic circuits of logic gates such as AND-gates, OR-gates, and NOT-gates.

The memory circuit 42 is provided to store informations for controlling the sub-control circuit 41 and the selecting circuit 44. These informations have previously been stored in the memory circuit 42 through initialization process.

The latch circuit 43 may comprise a flip-flop circuit. The latch circuit 43 receives the result of the logic operations from the sub-control circuit 41 to latch the same until the latch circuit 43 receives an input of a synchronizing signal 47. The latch circuit 43 sends the latched result of the logic operations to the selecting circuit 44 in synchronizing with input of the received synchronizing signal 47.

The selecting circuit 44 receives an output signal from the latch circuit 43. The selecting circuit 44 also receives an output signal from the sub-control circuit 41. The selecting circuit 44 also receives the information from the memory circuit 42. The selecting circuit 44 performs to select any one of the output signals from the sub-control circuit 41 and the latch circuit 43 in accordance with the information from the memory circuit 42.

Operations of the above programmable device of this second embodiment are the same as in the first embodiment except for the followings. The descriptions will focus on differences in operations of the programmable device of this second embodiment from the first embodiment. A plurality of the configurable informations have already been stored in the internal memory 111 of the programmable cell 11. A memory information for allowing the selecting circuit 44 to select one of the output signals from the sub-control circuit 41 and from the latch circuit 43 has also been stored in the memory circuit 42 in the control circuit 31.

Control information is supplied from an external connective terminal which is connected to the second sub-interconnection network 14. The control information is transmitted through the interconnection constituting the second sub-interconnection network 14 to the control circuit 31. If the control information is switched, then the switched control information is first transmitted from the external connective terminal through the interconnection constituting the second sub-interconnection network 14 to the sub-control circuit 41 in the control circuit 31. The same control information as the inputted control information is outputted from the sub-control circuit 41. The outputted control information is transmitted to the latch circuit 43 and the selecting circuit 44. At this time, the synchronizing signal 47 has not yet inputted into the latch circuit 43, for which reason the latch circuit 43 remains to latch the previous control information. The selecting circuit 44 thus selects the previous control information to output the same therefrom. The previous control information outputted from the selecting circuit 44 is then transmitted through the common control information transmission line 29 to the four control information input ports 18 of the four programmable cells 11 which form a 2×2 sub-cell array 21. Upon input of the synchronizing signal 47 into the latch circuit 43, the switched control information is outputted from the latch circuit 43. The switched control information is then supplied to the selecting circuit 44 so that the selecting circuit 44 selects the switched control information and outputs the same therefrom. The switched control information is then transmitted through the common control information transmission line 29 to the four control information input ports 18 of the four programmable cells 11 which form a 2×2 sub-cell array 21.

Namely only four programmable cells 11 which form a 2×2 sub-cell array 21 receive the switched control information. The switched control information is supplied to the programmable cells 11 without a large delay from the input of the synchronizing signal 47 into the latch circuit 43 in the control circuit 31, so that the internal memory 111 in each of the programmable cells 11 receives the switched control information, whereby the internal memory 111 selects, in accordance with the switched control information, different one of the configurable informations stored therein from the past selected one of the configurable informations configurable information. The newly selected one of the configurable informations is then transmitted from the internal memory 111 to the combined logic circuit 112. The control circuit 31 is, in case, further connected to the interconnection of the second sub-interconnection network 14 which is connected to the output port 19 of the other programmable cell 11.

If the control circuit 31 switches the control information to be transmitted through the common control information transmission line to the four internal memories 111 in the four programmable cells 11 which forms the 2×2 sub-array 21, then the four internal memories 111 in the four programmable cells 11 switch the configurable informations in accordance with the common control information. The memory circuit 42 and the sub-control circuit 41 are so set that in a transition time period until the control information has completely been switched, the sub-control circuit 41 remains to output the previous arithmetic result. After the control information has completely been switched, then the sub-control circuit 41 outputs a new arithmetic result based upon the logic operation of the switched configurable information and the data input information.

As described above, the control information input ports 18 of the four the programmable cells 11 which form the 2×2 sub-cell array 21 are connected through the common control circuit 31 and the single common control information input port 29 to the same interconnection of the second sub-interconnection networks 14, so that upon input of the synchronizing signal 47 into the latch circuit 43, the control circuit 31 switches the control information, whereby the switched control information is transmitted into the four programmable cells 11 forming the 2×2 sub-cell array 21, so that the configurable information to be outputted from the internal memory 111 is switched without any large delay in time. This makes it possible to shorten the necessary time for outputting the arithmetic result from the combined logic circuit 112.

Whereas, in this third embodiment, data are transmitted through the first sub-interconnection network 13 and the data input port 17 to the combined logic circuit 112 in the programmable cell 11 whilst the control informations are transmitted through the second sub-interconnection network 14 and the control information input port 18 to the internal memory 111 in the programmable cell 11. It is, however, possible to modify the above structure into the following. Namely, adjacent two of the programmable cells are interconnected to each other through a private line, so that the data input information and the control information are directly sent from one of the programmable cell to another one.

Whereas, in this third embodiment, the programmable cells are shaped in rectangle and aligned in matrix, it is possible to modify the programmable cells to that the programmable cells are shaped in hexagon and aligned in honeycomb and first and second sub-interconnection networks extend to surround the programmable cells.

Whereas, in this third embodiment, the sub-cell array comprises the 2×2 arrays of four programmable cells and the single common control information transmission line is provided for each of the sub-cell array and connected to the four control information input ports of the four programmable cells in the sub-cell array, it is possible to modify the array to that the sub-cell array comprises an m×n array of the programmable cells, where m and n are the integers of not less than 1. The sub-cell array may also comprise other arrays than the matrix array. It is also possible that the sub-cell arrays are different in the number of the programmable cells included in the sub-cell arrays.

Whereas, in this third embodiment, the control circuit 31 has the circuit configuration as shown in the drawing, it is possible to modify the circuit configuration of the control circuit, provided that the control circuit 31 is capable of holding the control informations supplied from the second sub-interconnection network or an arithmetic result information obtained by operation thereto and also capable of sending the control information to the programmable cells in the sub-cell array in synchronizing with the input of the synchronizing signal into the control circuit.

Fourth Embodiment

Figure 6:
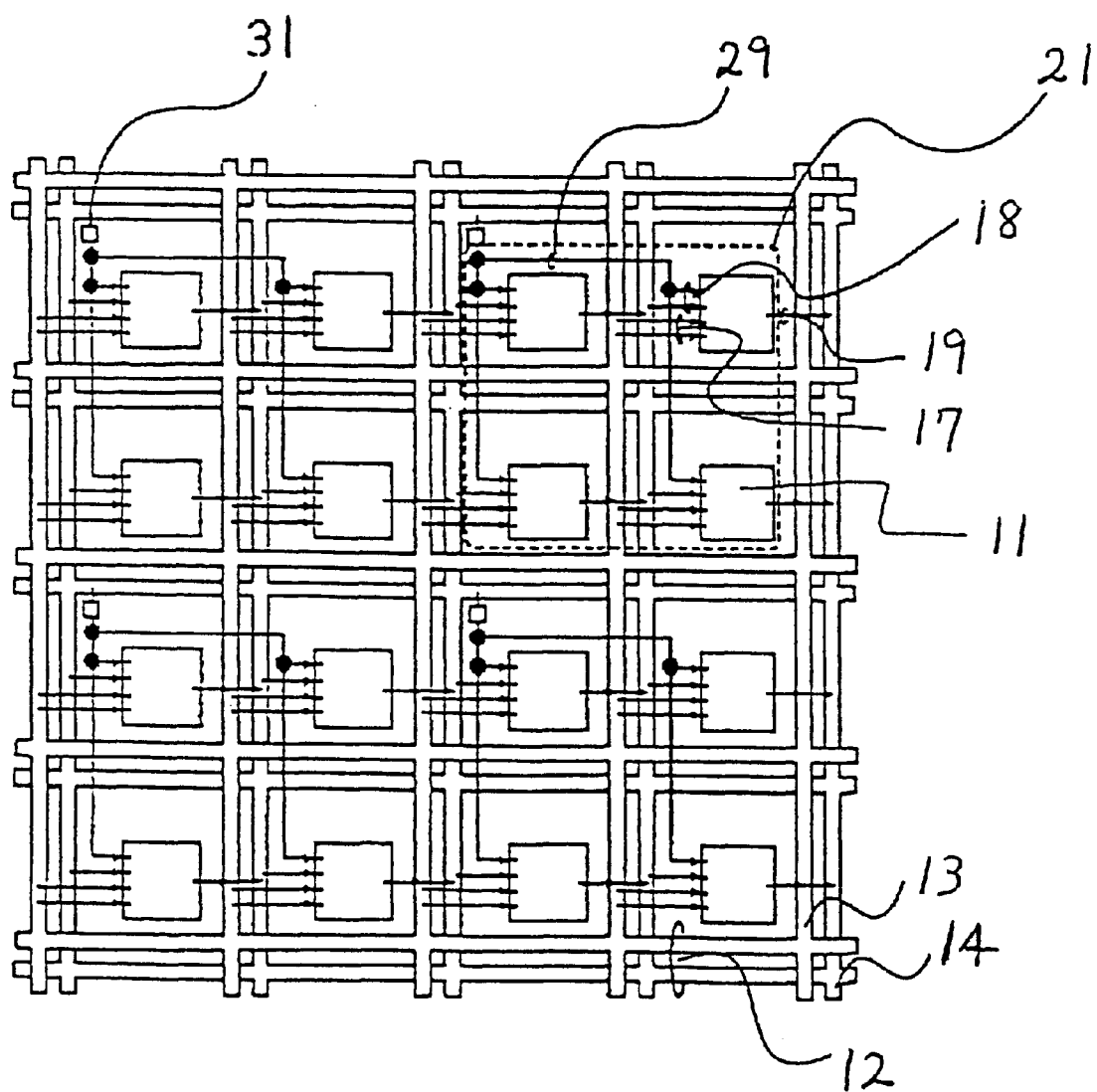
FIG. 6 is a block diagram illustrative of a configuration of a programmable device in a fourth embodiment in accordance with the present invention.

A fourth embodiment according to the present invention will be described in detail with reference to the drawings. FIG. 6 is a block diagram illustrative of a configuration of a programmable device in a fourth embodiment in accordance with the present invention. The programmable device has a two-dimensional array of a plurality of sub-cell arrays 21. Each of the sub-cell arrays 21 comprises a 2×2 array of programmable cells 11. The programmable device further has interconnection networks 12 surrounding each of programmable cells 11. The interconnection networks 12 comprise first sub-interconnection networks 13 for transmission of data and second sub-interconnection networks 14 for transmission of control informations. Each of the sub-cell arrays 21 has a common control information input line 29 which is connected to four control information input ports 18 of the four programmable cells 11 which form the 2×2 sub-cell array 21. The common control information input line 29 is also connected through a control circuit 31 to one interconnection of the second sub-interconnection networks 14, so that the four control information input ports 18 of the four programmable cells 11 which form the 2×2 sub-cell array 21 are connected through the common control information input line 29 and the control circuit 31 to the one interconnection of the second sub-interconnection networks 14. Namely, each of the sub-cell arrays 21 has the single control circuit 31. The control circuit 31 is supplied with a synchronizing signal transmitted through an interconnection not illustrated. Other configurations are the same as in the first embodiment, for which reason the descriptions will be omitted.

Figure 7:
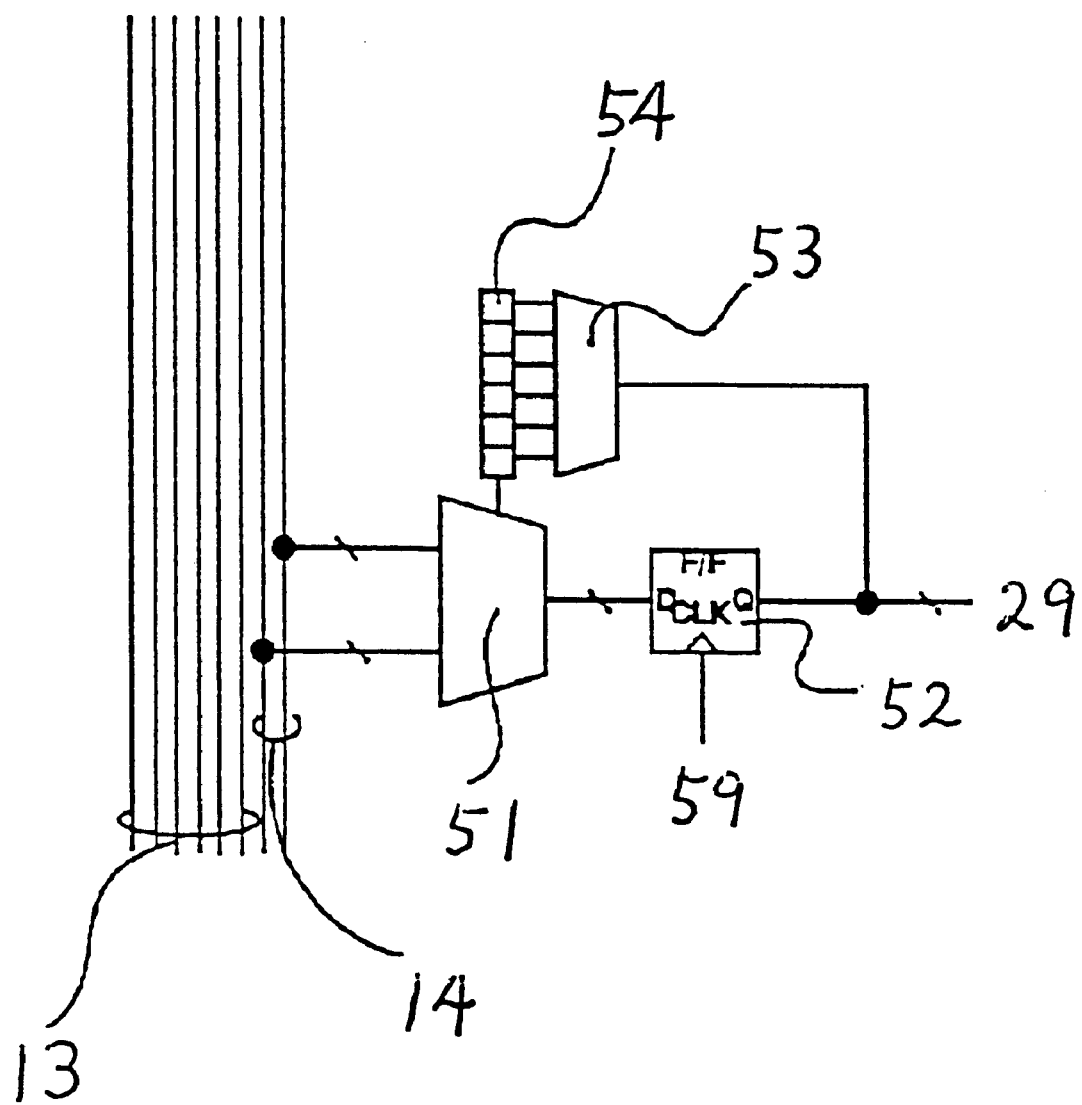
FIG. 7 is a block diagram illustrative of a configuration of the control circuit shown in FIG. 6.

FIG. 7 is a block diagram illustrative of a configuration of the control circuit shown in FIG. 6. The control circuit 31 is connected between the interconnection of the second sub-interconnection networks 14 and the common control information input line 29. The control circuit 31 comprises a selecting circuit 51, a memory circuit 54, a decoder circuit 53, and a flip-flop circuit 52.

The selecting circuit 51 is connected to first and second interconnection groups constituting the second sub-interconnection network 14 for the control information transmission. The selecting circuit 51 is also connected to the memory circuit 54. The selecting circuit 51 is also connected to the flip-flop 52. The selecting circuit 51 receives first and second control informations transmitted through the first and second interconnection groups constituting the second sub-interconnection network 14. The selecting circuit 51 also receives an information stored in the memory circuit 54 therefrom so that the selecting circuit 51 selects any one of the first and second control informations in accordance of the information fetched from the memory circuit 54 to transmit the selected one of the first and second control informations to the flip-flop 52. Whereas in FIG. 7, the first and second interconnection groups constituting the second sub-interconnection network 14 are completely separated, it is possible that the first and second interconnection groups may partially overlap.

The flip-flop 52 is connected to the selecting circuit 51. The flip-flop 52 is also connected to the common control information transmission line 29. The flip-flop 52 is also connected to the decoder circuit 53. The flip-flop 52 comprises a D-flip-flop responsible for the number of bits of the output signal from the selecting circuit 51 or the selected one of the first and second control informations. The flip-flop 52 receives a clock signal 59 so that the flip-flop 52 sends the selected one of the first and second control informations to the common control information transmission line 29 and also to the decoder circuit 53 in synchronizing with the clock signal 59. The flip-flop 52 keeps the current output state until the flip-flop 52 receives the next input of the clock signal 59.

The decoder circuit 53 is connected to the output terminal of the flip-flop circuit 52 for receiving the output signal from the flip-flop 52 to decode the received output signal, so that the information stored on the memory circuit is selected in accordance with the decoded signal from the decoder circuit 53 to send the selected information to the selecting circuit 51, whereby the selecting circuit 51 selects any one of the first and second control informations in accordance of the information from the memory circuit 54.

As described above, the control information is switched by the control circuit 31 in synchronizing with the input of the clock signal 59 into the flip-flop 59 in the control circuit 31, so that the switched control information is transmitted through the common control information transmission line 29 to the four internal memories 111 in the four programmable cells 11 which forms the single 2×2 sub-cell array 21, so that upon input of the clock signal 59 into the flip-flop 52, the control circuit 31 switches the control information, whereby the switched control information is transmitted into the four programmable cells 11 forming the 2×2 sub-cell array 21, so that the configurable information to be outputted from the internal memory 111 is switched without any large delay in time. This makes it possible to shorten the necessary time for outputting the arithmetic result from the combined logic circuit 112.

Whereas, in this fourth embodiment, data are transmitted through the first sub-interconnection network 13 and the data input port 17 to the combined logic circuit 112 in the programmable cell 11 whilst the control informations are transmitted through the second sub-interconnection network 14 and the control information input port 18 to the internal memory 111 in the programmable cell 11. It is, however, possible to modify the above structure into the following. Namely, adjacent two of the programmable cells are interconnected to each other through a private line, so that the data input information and the control information are directly sent from one of the programmable cell to another one.

Whereas, in this fourth embodiment, the programmable cells are shaped in rectangle and aligned in matrix, it is possible to modify the programmable cells to that the programmable cells are shaped in hexagon and aligned in honeycomb and first and second sub-interconnection networks extend to surround the programmable cells.

Whereas, in this fourth embodiment, the sub-cell array comprises the 2×2 arrays of four programmable cells and the single common control information transmission line is provided for each of the sub-cell array and connected to the four control information input ports of the four programmable cells in the sub-cell array, it is possible to modify the array to that the sub-cell array comprises an m×n array of the programmable cells, where m and n are the integers of not less than 1. The sub-cell array may also comprise other arrays than the matrix array. It is also possible that the sub-cell arrays are different in the number of the programmable cells included in the sub-cell arrays.

Whereas, in this fourth embodiment, the control circuit 31 has the circuit configuration as shown in the drawing, it is possible to modify the circuit configuration of the control circuit, provided that the control circuit 31 is capable of holding the control informations supplied from the second sub-interconnection network or an arithmetic result information obtained by operation thereto and also capable of sending the control information to the programmable cells in the sub-cell array in synchronizing with the input of the synchronizing signal into the control circuit.

Whereas further modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A programmable device comprising:
   an array of plural programmable cells connected to an interconnection network, said interconnection network transmitting at least control information to the plural programmable cells, so that each of the plural programmable cells selects one of plural configurable information in accordance with the control information, and each of the programmable cells comprising at least an internal memory for storing the plural configurable information, said internal memory connected to the interconnection network for receiving the control information so that the internal memory selects one of the plural configurable information in accordance with the control information; and an arithmetic logic circuit connected to the internal memory for receiving the selected one of the plural configurable information, said arithmetic logic circuit also connected to the interconnection network for receiving data from the interconnection network to perform logic operations of the selected one of the plural configurable information and the data and send an arithmetic result to the interconnection network.

2. The programmable device as claimed in claim 1, wherein the interconnection network extends to surround each of the plural programmable cells, and the interconnection network comprises a first sub-interconnection network comprising plural first interconnections for transmitting the data and a second sub-interconnection network comprising plural second interconnections for transmitting the control informations.

3. The programmable device as claimed in claim 2, wherein the internal memory is connected to the second sub-interconnection network for receiving the control informations from the second sub-interconnection network, and the arithmetic logic circuit is also connected to the first interconnection network for receiving sid data from the first interconnection network.

4. The programmable device as claimed in claim 3, wherein the array of plural programmable cells comprises a plurality of sub-cell arrays, and each of the sub-cell arrays having a plurality of the programmable cells which are connected to at least the same interconnection of the second sub-interconnection network for receiving the control information.

5. The programmable device as claimed in claim 4, wherein a single common control information transmission line is further provided for each of the sub-cell arrays, so that the programmable cells in the same sub-cell array are connected through the single common control information transmission line to the second sub-interconnection network.

6. The programmable device as claimed in claim 5, wherein a control circuit is further provided for each of the sub-cell arrays, so that the single common control information transmission line is connected through the control circuit to the second sub-interconnection network.

7. The programmable device as claimed in claim 6, wherein the control circuit stores the control information and sends the control information upon input of a synchronizing signal into the control circuit.

8. The programmable device as claimed in claim 7, wherein the control circuit comprises:

a memory circuit for storing a memory information;

a sub-control circuit connected to the second sub-interconnection network for receiving the control information from the second sub-interconnection network and also connected to the memory circuit for receiving the memory information from the memory circuit, so that the sub-control circuit performs logic operations of the control information and the memory information to output an arithmetic result;

a latch circuit connected to the sub-control circuit for receiving the arithmetic result from the sub-control circuit and latches the arithmetic result to output the arithmetic result in synchronizing with an input of a synchronizing signal; and a selecting circuit being connected to the latch circuit for receiving the arithmetic result from the latch circuit, and also the selecting circuit being connected to the sub-control circuit for receiving the arithmetic result from the sub-control circuit, and also the selecting circuit being connected to the memory circuit for receiving the memory information from the memory circuit, so that the selecting circuit selects one of the arithmetic results in accordance with the memory information to output selected one of the arithmetic results as a selected control information.

9. The programmable device as claimed in claim 7, wherein the control circuit is connected to plural interconnections of the second sub-interconnection network, and the plural interconnections being different at least partially from each other for receiving plural control informations from the plural interconnections.

10. The programmable device as claimed in claim 9, wherein the control circuit comprises:

a memory circuit for storing plural memory informations, and the memory circuit being connected to a decoder circuit for receiving a decoded signal from the decoder circuit, so that the memory circuit selects one of the plural memory informations in accordance with the decoded signal;

a selecting circuit being connected to the plural interconnections of the second sub-interconnection network for receiving the plural control informations, and the selecting circuit being also connected to the memory circuit for receiving selected one of the plural memory informations, so that the selecting circuit selects one of the plural control informations to output selected one of the control informations; and a flip-flop circuit being connected to the selecting circuit for receiving the selected control information from the selecting circuit and holds the control information to output the selected control information in synchronizing with an input of a clock signal into the flip-flop circuit.

11. A programmable device comprising:

an array of plural programmable cells;

a first sub-interconnection network comprising a plurality of first interconnections which extend to surround each of the plural programmable cells for transmitting data; and a second sub-interconnection network comprising a plurality of second interconnections which extend to surround each of the plural programmable cells for transmitting control informations, so that each of the plural programmable cells selects one of plural configurable informations stored therein in accordance with the control information supplied from the second sub-interconnection network.

12. The programmable device as claimed in claim 11, wherein each of the programmable cells further comprises:

at least an internal memory for storing the plural configurable informations, and the internal memory being connected to the second sub-interconnection network for receiving the control information so that the internal memory selects one of the plural configurable informations in accordance with the control informations; and an arithmetic logic circuit being connected to the internal memory for receiving the selected one of the plural configurable informations, and the arithmetic logic circuit being also connected to the first sub-interconnection network for receiving the data from the first sub-interconnection network to perform logic operations of the selected one of the plural configurable informations and the data and send an arithmetic result to the first sub-interconnection network.

13. The programmable device as claimed in claim 11, wherein the array of plural programmable cells comprises a plurality of sub-cell arrays, and each of the sub-cell arrays having a plurality of the programmable cells which are connected to at least the same interconnection of the second sub-interconnection network for receiving the control information.

14. The programmable device as claimed in claim 13, wherein a single common control information transmission line is further provided for each of the sub-cell arrays, so that the programmable cells in the same sub-cell array are connected through the single common control information transmission line to the second sub-interconnection network.

15. The programmable device as claimed in claim 14, wherein a control circuit is further provided for each of the sub-cell arrays, so that the single common control information transmission line is connected through the control circuit to the second sub-interconnection network.

16. The programmable device as claimed in claim 15, wherein the control circuit stores the control information and sends the control information upon input of a synchronizing signal into the control circuit.

17. The programmable device as claimed in claim 16, wherein the control circuit comprises:

a memory circuit for storing a memory information;

a sub-control circuit connected to the second sub-interconnection network for receiving the control information from the second sub-interconnection network and also connected to the memory circuit for receiving the memory information from the memory circuit, so that the sub-control circuit performs logic operations of the control information and the memory information to output an arithmetic result;

a latch circuit connected to the sub-control circuit for receiving the arithmetic result from the sub-control circuit and latches the arithmetic result to output the arithmetic result in synchronizing with an input of a synchronizing signal; and a selecting circuit being connected to the latch circuit for receiving the arithmetic result from the latch circuit, and also the selecting circuit being connected to the sub-control circuit for receiving the arithmetic result from the sub-control circuit, and also the selecting circuit being connected to the memory circuit for receiving the memory information from the memory circuit, so that the selecting circuit selects one of the arithmetic results in accordance with the memory information to output selected one of the arithmetic results as a selected control information.

18. The programmable device as claimed in claim 16, wherein the control circuit is connected to plural interconnections of the second sub-interconnection network, and the plural interconnections being different at least partially from each other for receiving plural control informations from the plural interconnections.

19. The programmable device as claimed in claim 18, wherein the control circuit comprises:

a memory circuit for storing plural memory informations, and the memory circuit being connected to a decoder circuit for receiving a decoded signal from the decoder circuit, so that the memory circuit selects one of the plural memory informations in accordance with the decoded signal;

a selecting circuit being connected to the plural interconnections of the second sub-interconnection network for receiving the plural control informations, and the selecting circuit being also connected to the memory circuit for receiving selected one of the plural memory informations, so that the selecting circuit selects one of the plural control informations to output selected one of the control informations; and a flip-flop circuit being connected to the selecting circuit for receiving the selected control information from the selecting circuit and holds the control information to output the selected control information in synchronizing with an input of a clock signal into the flip-flop circuit.

\* \* \* \* \*